US009250294B2

(12) United States Patent
Wagner et al.

(10) Patent No.: US 9,250,294 B2
(45) Date of Patent: Feb. 2, 2016

(54) METHOD FOR DETECTING A SWITCHING POSITION OF A SWITCHING DEVICE

(71) Applicant: Leopold Kostal GmbH & Co. KG, Luedenscheid (DE)

(72) Inventors: Martin Wagner, Luedenscheid (DE); Werner Thormann, Halver (DE); Meinolf Kathol, Finnentrop (DE); Rainer Buehlmann, Holzwickede (DE); Sven Kober, Bonn (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 542 days.

(21) Appl. No.: 13/716,280

(22) Filed: Dec. 17, 2012

(65) Prior Publication Data

US 2013/0106200 A1    May 2, 2013

Related U.S. Application Data

(63) Continuation of application No. PCT/EP2011/061780, filed on Jul. 11, 2011.

(30) Foreign Application Priority Data

Jul. 13, 2010   (DE) .......................... 10 2010 026 919

(51) Int. Cl.
*H01H 47/00* (2006.01)
*G01R 31/327* (2006.01)
(Continued)

(52) U.S. Cl.
CPC ............ *G01R 31/327* (2013.01); *B60Q 1/1469* (2013.01); *G01D 3/08* (2013.01);
(Continued)

(58) Field of Classification Search
CPC .... B60Q 1/1469; G01R 31/327; H03K 17/00; G01D 3/08; G01D 5/252

USPC ......... 307/112, 113, 115, 125, 126, 128, 130, 307/131, 132 E, 139; 324/525, 691, 693, 324/699
See application file for complete search history.

(56) References Cited

U.S. PATENT DOCUMENTS 4,785,194 A * 11/1988 Gottlieb ........................ 307/10.1
5,508,626 A    4/1996 Halin et al.
(Continued)

FOREIGN PATENT DOCUMENTS

DE      19512896 A1   10/1996
DE      69401403 T2    5/1997
(Continued)

OTHER PUBLICATIONS

The International Bureau of WIPO, International Preliminary Report on Patentability for the corresponding PCT/EP2011/061780 mailed Jan. 24, 2013.
(Continued)

*Primary Examiner* — Daniel Cavallari
(74) *Attorney, Agent, or Firm* — Brooks Kushman P.C.

(57) ABSTRACT

A switch is formed by a branch including a measurement resistance and a selectable one of switching resistances having different nominal values such that a switch position depends on which switching resistance is selected. The measurement resistance is connected through the selected switching resistance to a supply voltage whereby a voltage drop dependent on the switch position is across the measurement resistance. A controller identifies the switch position by comparison of a measured value ($U_{M1}$) of the voltage drop with target voltage drops corresponding to switch positions, calculates a voltage drop (Uges) across the branch based on nominal values of the measurement and selected switching resistances and the supply voltage, forms a difference value ($U_{Diff}$) between a measured value ($U_{Vcc}$) of the supply voltage and the branch voltage drop (Uges), and qualifies the identified switch position as faulty when the difference value ($U_{Diff}$) exceeds a difference threshold value ($U_{Diff-S}$).

7 Claims, 1 Drawing Sheet

(51) Int. Cl.
*B60Q 1/14* (2006.01)
*G01D 3/08* (2006.01)
*G01D 5/252* (2006.01)
*H03K 17/00* (2006.01)
*H01H 1/00* (2006.01)

(52) U.S. Cl.
CPC ............... *G01D 5/252* (2013.01); *H03K 17/00* (2013.01); *H01H 1/0015* (2013.01); *H01H 2239/012* (2013.01); *Y10T 307/826* (2015.04)

(56) References Cited

U.S. PATENT DOCUMENTS

| | | | |
|---|---|---|---|
| 5,544,089 A * | 8/1996 | Hemminger et al. | 702/64 |
| 5,621,398 A | 4/1997 | Blair et al. | |
| 5,656,928 A * | 8/1997 | Suzuki et al. | 324/71.1 |
| 6,236,197 B1 * | 5/2001 | Holdsclaw et al. | 324/110 |
| 7,446,691 B2 * | 11/2008 | Paul | 341/155 |
| 7,532,013 B2 * | 5/2009 | Terauchi | 324/549 |
| 8,432,174 B2 * | 4/2013 | Liu et al. | 324/691 |
| 8,612,840 B2 * | 12/2013 | Kehl | 714/800 |
| 8,618,959 B2 * | 12/2013 | Griffin | 341/22 |
| 8,760,168 B2 * | 6/2014 | Kudo et al. | 324/426 |
| 8,779,784 B2 * | 7/2014 | Yang et al. | 324/691 |
| 2004/0099530 A1 * | 5/2004 | Bolz | 204/406 |
| 2007/0290905 A1 * | 12/2007 | Kobayashi et al. | 341/126 |
| 2008/0024326 A1 * | 1/2008 | DiFatta et al. | 341/22 |
| 2009/0134890 A1 * | 5/2009 | Johnson | 324/713 |
| 2010/0020842 A1 * | 1/2010 | Riddle et al. | 374/1 |

FOREIGN PATENT DOCUMENTS

| | | |
|---|---|---|
| DE | 10061024 A1 | 6/2002 |
| DE | 10061025 A1 | 6/2002 |
| DE | 102008007650 A1 | 8/2009 |
| DE | 102008044115 A1 | 6/2010 |

OTHER PUBLICATIONS

German Patent Office, German Patent Office Search Report for the underlying DE 10 2010 026 919.0, dated Mar. 18, 2011.
European Patent Office, International Search Report for corresponding International Application No. PCT/ EP2011/061780 mailed Nov. 4, 2011.

* cited by examiner

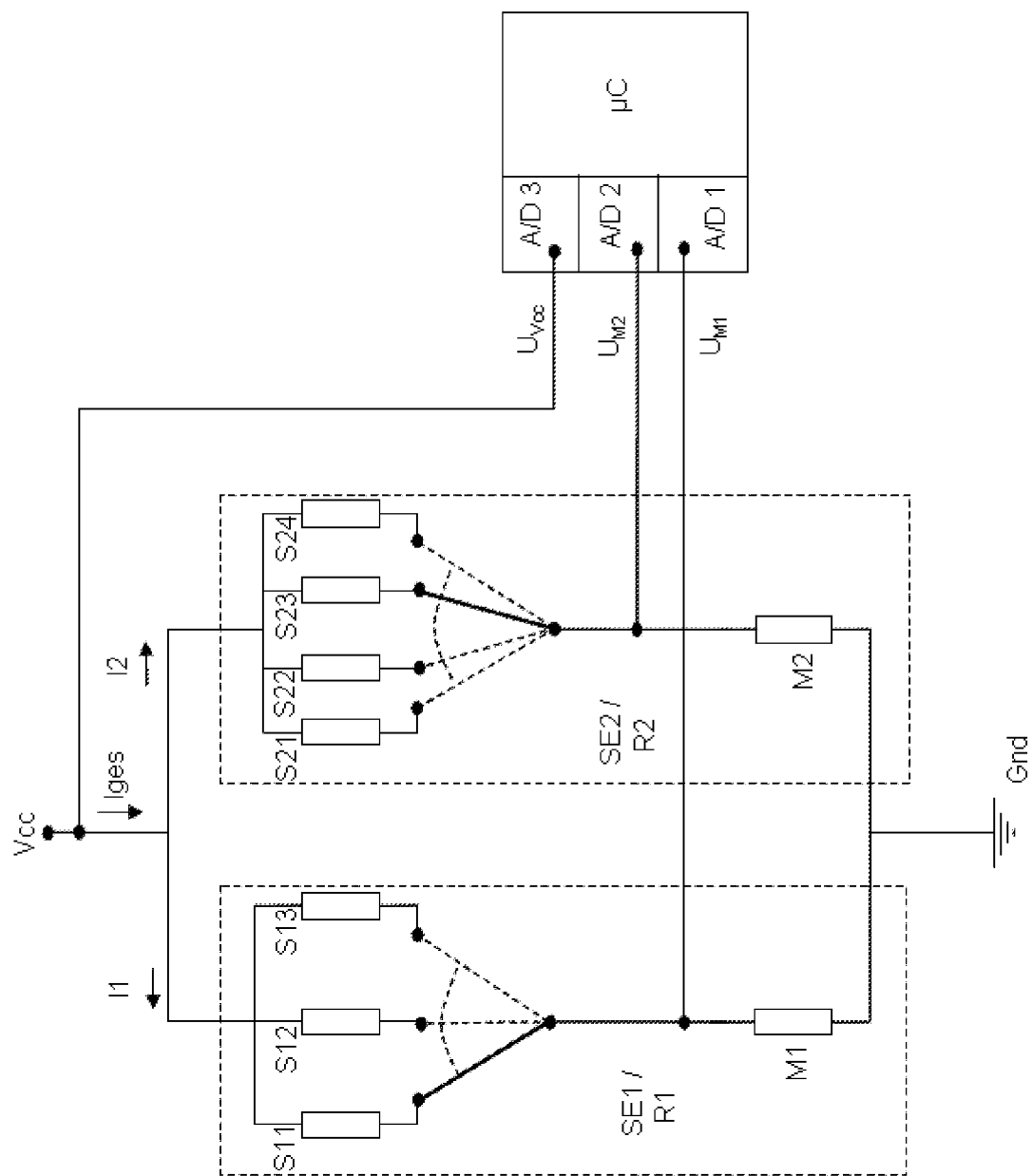

METHOD FOR DETECTING A SWITCHING POSITION OF A SWITCHING DEVICE

CROSS-REFERENCE TO RELATED APPLICATIONS

This application is a continuation of International Application No. PCT/EP2011/061780, published in German, with an International filing date of Jul. 11, 2011, which claims priority to DE 10 2010 026 919.0, filed Jul. 13, 2010; the disclosures of which are incorporated in their entirety by reference herein.

TECHNICAL FIELD

The present invention relates to detecting a switch position of a switch in which the switch position is represented by a value of a physically measured variable.

BACKGROUND

Switching devices are used, for example, in motor vehicles in order to control various vehicle functions. For instance, a steering column module typically has integrated therein a switching device having a plurality of individual switches. The switches are for controlling the windshield wiper and washer assembly, the blinkers, the high-beam lights of the vehicle, etc.

FIG. 1 illustrates a block diagram of a switch assembly in accordance with embodiments of the present invention. The switch assembly includes a switching device having a plurality of switches (in this example, a first switch SE1 and a second switch SE2) for controlling respective functions. For instance, first and second switches SE1, SE2 are for controlling first and second vehicle functions respectively.

Each switch SE1, SE2 is formed by a respective resistance branch. The resistance branch forming first switch SE1 includes a measurement resistance M1 and a switchable one of a plurality of switching resistances S11, S12, S13. Switching resistances S11, S12, S13 have different nominal resistance values amongst one another. The switch position of first switch SE1 depends on which switching resistance S11, S12, S13 is selected. First switch SE1 has three potential switch positions respectively corresponding with the three switching resistances S11, S12, and S13. As shown in FIG. 1, in this example, switching resistance S11 is selected such that first switch SE1 is in the switch position corresponding to switching resistance S11. Measurement resistance M1 is connected at one end to ground potential Gnd and is connected at its other end to a constant supply voltage Vcc through the selected one of the switching resistances S11, S12, S13. As such, in this example, the other end of measurement resistance M1 is connected to supply voltage Vcc through switching resistance S11 as first switch SE1 is in the switch position corresponding to switching resistance S11. Thus, in this switch position, the total resistance in the resistance branch forming first switch SE1 is measuring resistance M1 and switching resistance S11.

Likewise, the resistance branch forming second switch SE2 includes a measurement resistance R2 and a switchable one of a plurality of switching elements S21, S22, S23, S24. Switching resistances S21, S22, S23, S24 have different nominal resistance values amongst one another. The switch position of second switch SE2 depends on which switching resistance S21, S22, S23, S24 is selected. Second switch SE2 has four potential switch positions respectively corresponding with the four switching resistances S21, S22, S23, S24. As shown in FIG. 1, in this example, switching resistance S23 is selected such that second switch SE2 is in the switch position corresponding to switching resistance S23. Measurement resistance M2 is connected at one end to ground potential Gnd and is connected at its other end to supply voltage Vcc through, in this example, switching resistance S23 as second switch SE2 is in the switch position corresponding to switching resistance S23. Thus, in this switch position, the total resistance in the resistance branch forming second switch SE2 is measuring resistance M2 and switching resistance S23.

As shown in FIG. 1, the resistance branches of switches SE1, SE2, including the respective switching resistances (S11; S23 in this example) according to the respective selected switch positions, are connected in parallel to one another through a common electrical conductor to supply voltage Vcc.

The switching assembly includes a processor μC having analog-to-digital converter (ADC) inputs. In this example, the processor includes three ADC inputs A/D 1, A/D 2, and A/D 3.

In an operation for detecting the switch position of first switch SE1, the actual voltage drop $U_{M1}$ across measuring resistance M1 is measured. The measured voltage drop $U_{M1}$ is supplied to ADC input A/D 1 for evaluation by the processor Likewise, in an operation for detecting the switch position of second switch SE2, the actual voltage drop $U_{M2}$ across measuring resistance M2 is measured and supplied to ADC input A/D 2 for the processor. For both operations, the actual voltage $U_{Vcc}$ of supply voltage Vcc is measured and supplied to ADC input A/D 3 for the processor.

Measuring resistances M1, M2 and switching resistances S11, S12, S13; S21, S22, S23, S24 have known nominal resistance values. For instance, the nominal resistance values of switching resistances S11, S12, S13 are 1 k ohms, 10 k ohms, and 100 k ohms. Supply voltage $V_{cc}$ has a known nominal voltage value such as, for instance, 5V. Expected fixed set-points for the voltage drops across measuring resistors M1, M2 are obtained based on the nominal values. The predetermined fixed set-points are respectively associated with the different switch positions of switches SE1, SE2, and thus for the measured voltages $U_{M1}$, $U_{M2}$.

In the example in which first switch SE1 is in the switch position in which switching resistance S11 is selected, the measured voltage drop $U_{M1}$ occurring across measuring resistance M1 depends on the actual resistance values of measuring resistance M1 and switching resistance S11 and the actual voltage value of supply voltage Vcc. However, the voltage drop expected to across measuring resistance M1 depends on the nominal resistance values of measuring resistance M1 and switching resistance S11 and the nominal voltage value of supply voltage Vcc. Thus, if any of the actual values differ from the corresponding nominal values, then the measured voltage drop $U_{M1}$ will differ from the expected voltage drop. The same analysis applies to any other one of switching resistances and to second switch SE2.

Deviations of the actual resistance values from the nominal design values arise due to tolerances of the components and characteristic impedances or contact resistances at switches and connectors. This situation affects the entire switching device and can thus give rise to deviations in the measured voltages $U_{M1}$, $U_{M2}$ from the predetermined fixed set-points. If the deviations attain the order of magnitude of the intervals between the measured voltages $U_{M1}$, $U_{M2}$ associated respectively with the different switch positions, then this can lead to erroneous switch position information and thus to defective operation of the components powered by the switching device.

SUMMARY

With reference to FIG. 1, embodiments of the present invention are directed to detecting a switching position of a switch SE1, SE2 of a switching device. Each switch SE1, SE2 is formed by a respective resistance branch. Each resistance branch includes a measurement resistance M1, M2 and a switchable one of a plurality of switching resistances S11, S12, S13; S21, S22, S23, S24 connected in series. The switching resistances in each resistance branch have different nominal resistance values amongst one another. The switch position of each switch SE1, SE2 depends on which of the switching resistances is selected. In each resistance branch, the measurement resistance M1, M2 is connected at one end to ground potential and is connected at its other end to a supply voltage Vcc through the selected one of the switching resistances (e.g., as shown in FIG. 1, switching resistance S11, S23, respectively).

The switching position of a switch SE1, SE2 is represented by a respective value of a measured physical variable of the switch. For instance, the measured physical variable of the switch SE1, SE2 is the measured voltage drop $U_{M1}$, $U_{M2}$ across the measurement resistance M1, M2 of the switch. The measured value $U_{M1}$, $U_{M2}$ of the physical variable is supplied via an analog-to-digital converter (ADC) input to a processor for evaluation.

The operation of detecting the switching position of a switch SE1, SE2 in accordance with embodiments of the present invention includes identifying the switching position of the switch by comparing the measured value $U_{M1}$, $U_{M2}$ of the physical variable to predefined fixed target values of the physical variable. The predefined target values of the physical variable respectively correspond to the possible switching positions of the switch. The operation further includes calculating a deduced value Uges of a comparison physical variable for the identified switch position from a physical model of the switching device. The physical model of the switching device is based on the nominal values of the measuring resistances M1, M2 and the switching resistances S11, S12, S13; S21, S22, S23, S24 and the nominal value of the voltage supply Vcc. The operation further includes forming a difference value $U_{Diff}$ between the deduced value Uges of the physical comparison variable and either the nominal value Vcc or a currently detected actual value Uvcc of the physical comparison variable. The operation further includes comparing the difference value $U_{Diff}$ to a difference threshold value $U_{Diff-S}$. The operation further includes qualifying the present switching position detection as being faulty when the difference value $U_{Diff}$ exceeds the difference threshold value $U_{Diff-S}$.

As described, the physically measured variables concern voltage or current values, for example, with the nominal values of measuring resistance M1, M2 and switching resistances S11, S12, S13; S21, S22, S23, S24 that determine the measured variables of resistance, capacitance, or inductance, and for the input parameters of the switching device of supply voltage values or input current values. The physical comparison parameters, for example, relate to one of these values, which is calculated as a value derived from other measured values that can be presented as a nominal value or as an actual value, which can be acquired by an actual measurement.

It is preferable when the acquisition of an existing switch position is qualified as being erroneous that the triggering of the associated vehicle function is thereby suppressed.

Accordingly, objects of the present invention include having at one's disposal a possibility for validation of the switch position derived from the measured voltages $U_{M1}$, $U_{M2}$ to at least suppress triggering of the related switch function in case of potentially erroneous switch position information, and correcting erroneous switch position information and triggering the actually intended function. Such a validation of the detection of a switch position is achieved by the embodiments of the present invention directed to detecting a switching position of a switch of a switching device as described above.

In carrying out at least one of the above and other objects, the present invention provides a switching assembly having a switching device and a controller. The switching device has a switch formed by a resistance branch including a measurement resistance and a selectable one of a plurality of switching resistances having different nominal resistance values amongst one another such that a switch position of the switch depends on which switching resistance is selected. The measurement resistance is connected at one end to ground and connected at another end through the selected switching resistance to a supply voltage whereby a voltage drop dependent on the switch position of the switch occurs across the measurement resistance. The controller is configured to identify the switch position by comparison of a measured value ($U_{M1}$) of the voltage drop across the measurement resistance with predefined target voltage drops respectively corresponding to different switch positions dependent on the switching resistances, calculate a voltage drop (Uges) across the resistance branch based on nominal resistance values of the measurement resistance and the selected switching resistance and a nominal value of the supply voltage, form a difference value ($U_{Diff}$) between a measured value ($U_{Vcc}$) of the supply voltage and the calculated voltage drop (Uges) across the resistance branch, compare the difference value ($U_{Diff}$) to a difference threshold value ($U_{Diff-S}$), and qualify the identified switching position as being faulty when the difference value ($U_{Diff}$) exceeds the difference threshold value ($U_{Diff-S}$).

Further, in carrying out at least one of the above and other objects, the present invention provides another switching assembly having a switching device and a controller. The switching device has first and second switches formed by respective resistance branches including a measurement resistance and a selectable one of a plurality of switching resistances having different nominal resistance values amongst one another such that a switch position of each switch depends on which switching resistance is selected. In each resistance branch the measurement resistance being connected at one end to ground and connected at another end through the selected switching resistance to a supply voltage whereby a voltage drop dependent on the switch position of the switch occurs across the measurement resistance and whereby the resistance branches are connected in parallel. The controller is configured to identify the respective switch positions of the switches by comparison of measured values ($U_{M1}$, $U_{M2}$) of the voltage drops across the measurement resistances with predefined target voltage drops respectively corresponding to different switch positions dependent on the switching resistances, calculate currents (I1, I2) flowing in the respective resistance branches from the measured voltages ($U_{M1}$, $U_{M2}$) and nominal values of the measuring resistances. The branch currents added together are equal to a total current (Iges) through all of the resistance branches. This controller is further configured to calculate a total resistance (Rges) formed by the parallel connection of the resistance branches from the nominal values of the measuring resistances and the selected switching resistances, calculate a total voltage drop (Uges) across the parallel-connected resistance branches from the calculated values of the total current (Iges) and the total resistance (Rges), form a difference value ($U_{Diff}$) between a measured value ($U_{Vcc}$) of the supply voltage and the calculated total voltage drop (Uges), compare the difference value ($U_M$) to a difference threshold value ($U_{Diff-S}$), and qualify the identified switching positions as being faulty when the difference value ($U_{Diff}$) exceeds the difference threshold value ($U_{Diff-S}$).

Also, in carrying out at least one of the above and other objects, the present invention provides another switching assembly having a switching device and a controller. The switching device is the same switching device noted above with the first and second switches. The controller is configured to identify the respective switch positions of the switches by comparison of measured values ($U_{M1}$, $U_{M2}$) of the voltage drops across the measurement resistances with predefined target voltage drops respectively corresponding to different switch positions dependent on the switching resistances, calculate currents (I1, I2) flowing in the respective resistance branches from the measured voltages ($U_{M1}$, $U_{M2}$) and nominal values of the measuring resistances, calculate branch voltage drops (U1, U2) across the respective resistance branches from the respective branch currents (I1, I2) and the respective nominal total values of measuring resistances and the selected switching resistances, form a difference value ($U_{Diff}$) between a measured value ($U_{Vcc}$) of the supply voltage and a largest one of the branch voltage drops (U1, U2), compare the difference value ($U_{Diff}$) to a difference threshold value ($U_{Diff-S}$), and qualify the identified switching positions as being faulty when the difference value ($U_{Diff}$) exceeds the difference threshold value ($U_{Diff-S}$).

The above features, and other features and advantages of the present invention are readily apparent from the following detailed description thereof when taken in connection with the accompanying drawings.

BRIEF DESCRIPTION OF THE DRAWINGS

FIG. 1 illustrates a block diagram of a switch assembly in accordance with embodiments of the present invention.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Referring now to FIG. 1, a block diagram of a switch assembly in accordance with embodiments of the present invention is shown. As described above, the switch assembly includes a switching device having switches SE1, SE2 with each switch SE1, SE2 being formed by a respective resistance branch. The resistance branches respectively include a measurement resistance M1, M2 and a switchable one of a plurality of switching resistances S11, S12, S13; S21, S22, S23, S24. Each set of switching resistances have different nominal resistance values amongst one another. The switch position of each switch SE1, SE2 depends on which switching resistance is selected. As shown in FIG. 1, in this example, switching resistances S11, S23 are selected such that switches SE1, SE2 are respectively in the switch positions corresponding to switching resistances S11, S23. Measurement resistance M1, M2 is connected at one end to ground potential Gnd and is connected at its other end to supply voltage Vcc through the selected switching resistances S11, S23. Thus, in these switch positions, the total resistance in the resistance branch forming first switch SE1 is measuring resistance M1 and switching resistance S11 and the total resistance in the resistance branch forming second switch SE2 is measuring resistance M2 and switching resistance S23. As shown in FIG. 1, the resistance branches of switches SE1, SE2 are connected in parallel to one another through a common electrical conductor to supply voltage Vcc.

In one embodiment, an operation for detecting the switch positions of switches SE1, SE2 includes the following. The actual voltage drops $U_{M1}$, $U_{M2}$ across the respective measuring resistances M1, M2 in the resistance branches of switches SE1, SE2 are measured. The measured voltages $U_{M1}$, $U_{M2}$ are supplied to respective ADC inputs A/D 1, A/D 2 for the processor. The actual voltage $U_{Vcc}$ supplied by supply voltage Vcc is measured and supplied to ADC input A/D 3 for the processor.

The operation further includes identifying the respective switch positions of switches SE1, SE2 by comparison of measured voltages $U_{M1}$, $U_{M2}$ with predefined fixed target voltage values corresponding to the respective switch positions. The operation further includes calculating branch currents I1, I2 flowing in the respective resistance branches. Branch currents I1, I2 are calculated from measured voltages $U_{M1}$, $U_{M2}$ and the nominal values of measuring resistances M1, M2 according to the following equations: $I1 = U_{M1}/M1$; and $I2 = U_{M2}/M2$.

The branch currents I1, I2 flowing through the respective branches added together are equal to the total current Iges flowing through all of the resistance branches according to the equation: Iges=I1+I2. The operation further includes calculating the total resistance Rges formed by the parallel connection of the resistance branches between the ground potential Gnd and the supply voltage Vcc. The total resistance Rges is calculated from the nominal values of measuring resistances M1, M2 and the switching resistances in effect for the identified switch positions (in this example, switching resistances S11, S23) according to the following equations: R1=M1+S11; R2=M2+S23; and Rges=R1*R2/(R1+R2). The operation further includes calculating the total voltage drop Uges over the parallel-connected resistance branches. The total voltage drop Uges is calculated from the calculated values of the total current Iges and the total resistance Rges according to the equation: Uges=Iges*Rges.

The operation further includes calculating a voltage difference value $U_{Diff}$ between the calculated total voltage drop Uges and the prescribed or measured value of the applied supply voltage Vcc or $U_{Vcc}$ according to the following equation: $U_{Diff} = U_{Vcc} - Uges$. The operation further includes comparing the voltage difference value $U_{Diff}$ with a difference threshhold value $U_{Diff-S}$. The operation further includes qualifying the current acquisition of the switching position as being erroneous when the difference threshhold $U_{Diff-S}$ is exceeded by the current voltage difference value $U_{Diff}$ per the following equations: $U_{Diff} - U_{Diff-S} \leq 0 \rightarrow $ i.O.; $U_{Diff} - U_{Diff-S} > 0 \rightarrow $ "Error".

As described above, the operation for detecting the switch positions of switches SE1, SE2 of this embodiment is focused on the determination of errors that can occur particularly in the common conductors that affect all the resistance branches uniformly.

Errors of the type that can occur only in a single resistance branch can be detected by an operation for detecting the switch positions of switches SE1, SE2 in accordance with another embodiment. The switch position detection operation in accordance with this other embodiment further enables compensation for this error so that improved availability of the switching device is achieved.

In this other embodiment, the operation for detecting the switch positions of switches SE1, SE2 includes: measuring the actual voltage drops $U_{M1}$, $U_{M2}$ across the respective measuring resistances M1, M2; identifying the respective switch positions of switches SE1, SE2 by comparison of measured voltages $U_{M1}$, $U_{M2}$ with predefined fixed target voltage drop values corresponding to the respective switch positions; and calculating branch currents I1, I2 from measured voltages $U_{M1}$, $U_{M2}$ and the nominal values of measuring resistances M1, M2. As such, the initial operation process of this embodiment is the same as the preceding described embodiment. Consequently, the two operation processes can be run completely in parallel.

The operation for detecting the switch positions of switches SE1, SE2 in accordance with this other embodiment further includes the following. The branch voltage drops U1, U2 over the respective resistance branches are calculated. Branch voltage drops U1, U2 are calculated from the respective branch currents I1, I2 flowing in the resistance branches and the respective nominal total value of measuring resistances M1, M2 and the switching resistances effective in the identified switch positions (S11, S23 in this example) according to the following equations: U1=I1*(M1+S11); U2=I2*(M2+S23). The operation further includes forming a voltage difference value $U_{Diff}$ between the largest of the branch voltage drops U1, U2 and the prescribed or measured value of the applied supply voltage Vcc or $U_{Vcc}$ according to the following equations: $U_{Diff}=U_{Vcc}-U_{max}$, where $U_{max}$=maximum of U1,U2) The operation further includes comparing the voltage difference value $U_{Diff}$ with a difference threshhold value $U_{Diff-S}$. The operation further includes qualifying the present acquisition of the switching position as being erroneous when the difference threshhold $U_{Diff-S}$ exceeds the existing voltage difference value $U_{Diff}$ per the following equations: $U_{Diff}-U_{Diff-S}<=0 \rightarrow$i.O.; $U_{Diff}-U_{Diff-S}>0\rightarrow$"Error".

The voltage difference value $U_{Diff}$ with respect to the applied supply voltage $U_{Vcc}$ is formed from the largest of branch voltage drops U1, U2, since this determines the voltage level in all resistance branches through the parallel connection of the resistance branches. Smaller voltage drops in the other branches must thereby be caused by perturbation resistances within this branch. In the case of only a single resistance branch, the next operation process described here is identical to the previously described simpler operation process.

In order to compensate for perturbations, and thus to be able to correct possible measurement errors, in another embodiment, the sequence of procedural steps described in the next to last step establishes branch voltage drops U1, U2 that are scaled up to the designed or measured supply voltage Vcc or $U_{Vcc}$. To do this, a scaling factor SF1, SF2 is calculated for each resistance branch, which is formed by the quotients of the prescribed value Vcc or measured value $U_{Vcc}$ of the applied supply voltage and the respective branch voltage drop U1, U2 according to the following equations: SF1=$U_{Vcc}$/U1; SF2=$_{Vcc}$/U2

Measured voltages $U_{M1}$, $U_{M2}$ in the respective branches are multiplied by the scaling factors SF1, SF2 in the next step. The results obtained are compared as always with the prescribed fixed set point values for the different switch positions according to the following equations: $U_{M1}$scal=SF1*$U_{M1}$; $U_{M2}$ scal=SF2*$U_{M2}$.

Scaling enables possible error influences that give rise to deviations in the detected measured voltages $U_{M1}$, $U_{M2}$ to be compensated for the values anticipated based on design principles, so that a positive identification of the actual switch positions is made possible by the scaled measured voltages $U_{M1}$ scal, $U_{M2}$ scal.

Effective monitoring of possible error influences is possible by the continuous use of the methods in accordance with embodiments of the present invention during the acquisition of a switching position. The freely definable difference threshhold $U_{Diff-S}$ can also be used only for signaling an error situation without intervening in the function.

Slow or phasewise constant changes in the resistance can be readily compensated on the basis of methods in accordance with embodiments of the present invention. The entire state recognition window is thereby available for sudden resistance changes. This increases the availability.

While exemplary embodiments are described above, it is not intended that these embodiments describe all possible forms of the present invention. Rather, the words used in the specification are words of description rather than limitation, and it is understood that various changes may be made without departing from the spirit and scope of the invention. Additionally, the features of various implementing embodiments may be combined to form further embodiments of the present invention.

What is claimed is:

1. A switching assembly comprising:
a switching device having a switch formed by a resistance branch including a measurement resistance having a nominal resistance value and a selectable one of a plurality of switching resistances having different nominal resistance values amongst one another such that a switch position of the switch depends on which switching resistance is selected, the measurement resistance being connected at one end to ground and connected at another end through the selected switching resistance to a supply voltage whereby a voltage drop dependent on the switch position of the switch occurs across the measurement resistance; and
a controller configured to:
obtain a measured value of the voltage drop across the measurement resistance;
identify the switch position by comparison of the measured value of the voltage drop across the measurement resistance with predefined target voltage drops respectively corresponding to different switch positions dependent on the nominal resistance values of the switching resistances,
calculate a voltage drop across the resistance branch based on the measured value of the voltage drop across the measurement resistance, the nominal resistance value of the measurement resistance, and the nominal resistance value of the selected switching resistance,
form a difference value between a measured value of the supply voltage and the calculated voltage drop across the resistance branch,
compare the difference value to a difference threshold value, and qualify the identified switch position as being faulty when the difference value exceeds the difference threshold value.

2. The assembly of claim 1 wherein:
the controller is further configured to suppress a function associated with the switching position of the switch when the identified switching position is qualified as being erroneous.

3. The assembly of claim 1 wherein:
the switching device includes a second switch formed by a second resistance branch including a second measurement resistance having a nominal resistance value and a selectable one of a second plurality of switching resistances having different nominal resistance values amongst one another such that a switch position of the second switch depends on which switching resistance of the second plurality of switching resistances is selected, the second measurement resistance being connected at one end to ground and connected at another end through the selected switching resistance to the supply voltage whereby a voltage drop dependent on the switch position of the second switch occurs across the second measurement resistance and whereby the resistance branches are connected in parallel;
wherein the controller is further configured to:
obtain a measured value of the voltage drop across the second measurement resistance;
identify the switch position of the second switch by comparison of the measured value of the voltage drop across the second measurement resistance with predefined target voltage drops respectively corresponding to different switch positions dependent on the nominal resistance values of the switching resistances of the second plurality of switching resistances,
calculate a second voltage drop across the second resistance branch based on the measured value of the voltage drop across the second measurement resistance, the nominal resistance value of the second measurement resistance, and the nominal resistance value of the selected switching resistance of the second plurality of switching resistances,
form a second difference value between the measured value of the supply voltage and the calculated second voltage drop across the second resistance branch,
compare the second difference value to the difference threshold value, and
qualify the identified switch position of the second switch as being faulty when the second difference value exceeds the difference threshold value.

4. A switching assembly comprising:
a switching device having first and second switches formed by respective resistance branches including a measurement resistance having a nominal resistance value and a selectable one of a plurality of switching resistances having different nominal resistance values amongst one another such that a switch position of each switch depends on which switching resistance is selected, in each resistance branch the measurement resistance being connected at one end to ground and connected at another end through the selected switching resistance to a supply voltage whereby a voltage drop dependent on the switch position of the switch occurs across the measurement resistance and whereby the resistance branches are connected in parallel; and
a controller configured to:
obtain measured values of the voltage drops across the measurement resistances;
identify the respective switch positions of the switches by comparison of the measured values of the voltage drops across the measurement resistances with predefined target voltage drops respectively corresponding to different switch positions dependent on the nominal resistance values of the switching resistances,
calculate currents flowing in the respective resistance branches from the measured values of the voltage drops across the measurement resistances and the nominal resistance values of the measuring resistances, wherein the branch currents added together are equal to a total current through all of the resistance branches;
calculate a total resistance formed by the parallel connection of the resistance branches from the nominal resistance values of the measuring resistances and the selected switching resistances,
calculate a total voltage drop across the parallel-connected resistance branches from the calculated values of the total current and the total resistance,
form a difference value between a measured value of the supply voltage and the calculated total voltage drop,
compare the difference value to a difference threshold value, and
qualify the identified switch positions as being faulty when the difference value exceeds the difference threshold value.

5. The assembly of claim 4 wherein:
the controller is further configured to suppress functions associated with the switching positions of the switches when the identified switching positions are qualified as being erroneous.

6. A switching assembly comprising:
a switching device having first and second switches formed by respective resistance branches including a measurement resistance having a nominal resistance value and a selectable one of a plurality of switching resistances having different nominal resistance values amongst one another such that a switch position of each switch depends on which switching resistance is selected, in each resistance branch the measurement resistance being connected at one end to ground and connected at another end through the selected switching resistance to a supply voltage whereby a voltage drop dependent on the switch position of the switch occurs across the measurement resistance and whereby the resistance branches are connected in parallel; and
a controller configured to:
obtain measured values of the voltage drops across the measurement resistances;
identify the respective switch positions of the switches by comparison of the measured values of the voltage drops across the measurement resistances with predefined target voltage drops respectively corresponding to different switch positions dependent on the nominal resistance values of the switching resistances,
calculate currents flowing in the respective resistance branches from the measured values of the voltage drops across the measurement resistances and the nominal resistance values of the measuring resistances,
calculate branch voltage drops across the respective resistance branches from the respective branch currents and the respective nominal resistance values of
the measuring resistances and the selected switching
resistances, form a difference value between a measured value of the
supply voltage and a largest one of the branch voltage
drops, compare the difference value to a difference threshold
value, and qualify the identified switch positions as being faulty
when the difference value exceeds the difference
threshold value.

7. The assembly of claim 6 wherein:

the controller is further configured to suppress functions
associated with the switching positions of the switches
when the identified switching positions are qualified as
being erroneous.

* * * * *